US009741545B2

(12) United States Patent
Chen et al.

(10) Patent No.: US 9,741,545 B2
(45) Date of Patent: Aug. 22, 2017

(54) RPS ASSISTED RF PLASMA SOURCE FOR SEMICONDUCTOR PROCESSING

(71) Applicant: Applied Materials, Inc., Santa Clara, CA (US)

(72) Inventors: Xinglong Chen, San Jose, CA (US); Saurabh Garg, San Jose, CA (US); Jang-Gyoo Yang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/359,186

(22) Filed: Nov. 22, 2016

(65) Prior Publication Data

US 2017/0125220 A1 May 4, 2017

Related U.S. Application Data

(62) Division of application No. 14/603,638, filed on Jan. 23, 2015, now Pat. No. 9,502,218.
(Continued)

(51) Int. Cl.
*H01L 21/00* (2006.01)
*H01J 37/32* (2006.01)
(Continued)

(52) U.S. Cl.
CPC ...... *H01J 37/32422* (2013.01); *C23C 16/452* (2013.01); *C23C 16/45565* (2013.01);
(Continued)

(58) Field of Classification Search
CPC ........... H01J 37/32422; H01J 37/32357; H01J 37/32449; H01J 2237/334; C23C 16/452;
(Continued)

(56) References Cited

U.S. PATENT DOCUMENTS 5,844,195 A * 12/1998 Fairbairn .......... H01L 21/67017
156/345.34
5,865,896 A 2/1999 Nowak et al.
(Continued)

OTHER PUBLICATIONS

Non-Final Office Action in related U.S. Appl. No. 14/603,638 dated Apr. 27, 2016.

*Primary Examiner* — Thinh T Nguyen
(74) *Attorney, Agent, or Firm* — Patterson + Sheridan, LLP (57) ABSTRACT

Embodiments of the disclosure generally relate to a hybrid plasma processing system incorporating a remote plasma source (RPS) unit with a capacitively coupled plasma (CCP) unit for substrate processing. In one embodiment, the hybrid plasma processing system includes a CCP unit, comprising a lid having one or more through holes, and an ion suppression element, wherein the lid and the ion suppression element define a plasma excitation region, a RPS unit coupled to the CCP unit, and a gas distribution plate disposed between the ion suppression element and a substrate support, wherein the gas distribution plate and the substrate support defines a substrate processing region. In cases where process requires higher power, both CCP and RPS units may be used to generate plasma excited species so that some power burden is shifted from the CCP unit to the RPS unit, which allows the CCP unit to operate at lower power.

17 Claims, 4 Drawing Sheets

Related U.S. Application Data (60) Provisional application No. 61/934,325, filed on Jan. 31, 2014.

(51) Int. Cl.

| | |
|---|---|
| *C23C 16/452* | (2006.01) |
| *C23C 16/455* | (2006.01) |
| *C23C 16/505* | (2006.01) |
| *H01L 21/3065* | (2006.01) |
| *H01L 21/02* | (2006.01) |
| *H01L 21/67* | (2006.01) |

(52) U.S. Cl.
CPC ...... *C23C 16/505* (2013.01); *H01J 37/32357* (2013.01); *H01J 37/32449* (2013.01); *H01L 21/02274* (2013.01); *H01L 21/3065* (2013.01); *H01L 21/67069* (2013.01); *H01J 2237/334* (2013.01); *H01L 21/00* (2013.01); *H01L 21/67017* (2013.01)

(58) Field of Classification Search
CPC ........... C23C 16/45565; H01L 21/3065; H01L 21/02274; H01L 21/67069
USPC .... 438/3, 5, 9, 96, 758; 156/345.54, 345.55; 118/723, 715, 719
See application file for complete search history.

(56) References Cited

U.S. PATENT DOCUMENTS

| | | |
|---|---|---|
| 2001/0054387 A1 | 12/2001 | Frankel et al. |
| 2004/0071897 A1 | 4/2004 | Verplancken et al. |
| 2006/0005856 A1 | 1/2006 | Sun et al. |
| 2010/0098882 A1 | 4/2010 | Lubomirsky et al. |
| 2012/0187844 A1 | 7/2012 | Hoffman et al. |
| 2013/0084711 A1 | 4/2013 | Liang et al. |
| 2013/0153148 A1 | 6/2013 | Yang et al. |

* cited by examiner

RPS ASSISTED RF PLASMA SOURCE FOR SEMICONDUCTOR PROCESSING

CROSS-REFERENCE TO RELATED APPLICATIONS

This application is a divisional of U.S. patent application Ser. No. 14/603,638 filed Jan. 23, 2015, which claims benefit of U.S. Provisional Patent Application No. 61/934,325, filed Jan. 31, 2014, each which is herein incorporated by reference

BACKGROUND

Field

Embodiments of the present disclosure generally relate to an apparatus and method for processing gases and substrates in a semiconductor substrate process chamber.

Description of the Related Art

In the fabrication of semiconductor devices, plasma chambers commonly are used to perform various fabrication processes such as etching, chemical vapor deposition (CVD), and sputtering. Generally, a vacuum pump maintains a very low pressure within the chamber while a mixture of process gases continuously flows into the chamber and an electrical power source excites the gases into a plasma state. The constituents of the process gas mixture are chosen to effect the desired fabrication process It has been observed that some of conventional plasma processing chamber designs in which the plasma is generated between two parallel electrodes (i.e., capacitive coupling plasma) can cause unwanted particle contamination on a substrate surface due to ion bombardment of the electrodes. In deposition processes that require a higher RF input power (over 550 W), once the plasma has been created, a high self-induced negative DC bias is also naturally established at the powered electrode. The electrical potential difference between the plasma and the self-induced negative DC bias forms a sheath voltage at or near the powered electrode. This sheath voltage causes positive ions within the plasma to accelerate toward the powered electrode, resulting in ion bombardment of the powered electrode. In instances where the powered electrode includes a protective coating layer, a portion of the protective coating layer may flake off as a result of the ion bombardment after a long period of time and contaminate the substrate surface. While a lower RF input power can be used to generate the plasma (and thus reduce particle contamination), the film deposition rate will be decreased, which in turn lowers the process yield.

Therefore, there is a need in the art for an apparatus and process that effectively reduces the generation of contaminating particles on the substrate surface and maintains high process yield.

SUMMARY

Embodiments of the disclosure relate to a hybrid plasma processing system combining a primary plasma source, such as capacitively coupled plasma (CCP) source or inductively coupled plasma (ICP) source, and a secondary plasma source, such as remote plasma source (RPS). In one embodiment, a substrate processing system is provided. The system includes at least one primary plasma source unit, comprising a lid having one or more through holes, and an ion suppression element, wherein the lid and the ion suppression element define a plasma excitation region, and a remote plasma source (RPS) unit coupled to the at least one primary plasma source unit, wherein the one or more through holes of the lid are configured to fluidly connect a gas outlet of the RPS unit to the plasma excitation region, and a gas distribution plate disposed between the ion suppression element and a substrate support, wherein the gas distribution plate and the substrate support defines a substrate processing region.

In another embodiment, a substrate processing system includes a tandem processing chamber and a RPS unit coupled to the tandem processing chamber. The tandem processing chamber includes first and second processing chambers. The first processing chamber includes a first lid having a first gas inlet and a plurality of first holes surrounding the first gas inlet, wherein the first gas inlet is in fluid communication with a first gas source, a first ion suppression element arranged parallel to the first lid, wherein the first ion suppression element and the first lid define a first plasma excitation region, and a first gas distribution plate disposed between the first ion suppression element and a first substrate support, wherein the first gas distribution plate and the first substrate support defines a first substrate processing region within the first processing chamber. The second processing chamber is disposed adjacent to the first processing chamber and includes a second lid having a second gas inlet and a plurality of second holes surrounding the second gas inlet, wherein the second gas inlet is in fluid communication with the first gas source, and a second ion suppression element arranged parallel to the second lid, wherein the second ion suppression element and the second lid define a second plasma excitation region, and a second gas distribution plate disposed between the second ion suppression element and a second substrate support, wherein the second gas distribution plate and the second substrate support defines a second substrate processing region within the second processing chamber. The RPS unit includes a gas inlet and an gas outlet, wherein the gas inlet is in fluid communication with a second gas source, and the gas outlet is in fluid communication with the plurality of first holes and the plurality of second holes through a first gas passageway and a second gas passageway, respectively.

In yet another embodiment, a substrate processing system comprises a first processing chamber and a second processing chamber. The first processing chamber comprises a first primary plasma source unit, comprising a first lid having one or more through holes, wherein the first lid is in fluid communication with a first gas source, and a first ion suppression element, wherein the first lid and the first ion suppression element define a first plasma excitation region, and a first remote plasma source (RPS) unit coupled to the first primary plasma source unit, wherein the first RPS unit is in fluid communication with a first external gas source, and a first gas distribution plate disposed between the first ion suppression element and a first substrate support, wherein the first gas distribution plate and the first substrate support defines a first substrate processing region. The second processing chamber comprises a second primary plasma source unit, comprising a second lid having one or more through holes, wherein the second lid is in fluid communication with a second gas source, and a second ion suppression element, wherein second first lid and the second ion suppression element define a second plasma excitation region, a second remote plasma source (RPS) unit coupled to the second primary plasma source unit, wherein the first RPS unit is in fluid communication with a first external gas source, and a second gas distribution plate disposed between the second ion suppression element and a second substrate support, wherein the second gas distribution plate and the second substrate support defines a second substrate processing region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the disclosure relate to a hybrid plasma processing system combining a primary plasma source, such as capacitively coupled plasma (CCP) source or inductively coupled plasma (ICP) source, and a secondary plasma source, such as remote plasma source (RPS). The primary plasma source may be positioned adjacent to a substrate processing region and the secondary plasma source may be positioned further away from the substrate processing region. In one embodiment, the primary plasma source is positioned between the substrate processing region and the secondary plasma source. Depending upon process requirements, the primary plasma source and the secondary plasma source may subsequently turn on in any desired order for substrate processing. Alternatively, either the primary plasma source or the secondary plasma source is turned on for substrate processing. In cases where RPS and CCP are used for plasma generation and substrate processing, the RPS shares or relieves the power load of the CCP, thereby reducing ion bombardment of the powered electrode in the CCP to a lesser extent and allowing layers to be deposited/treated at lower temperatures with less particle contamination to the substrate surface.

While CCP unit is described in this disclosure as an example for the primary plasma source, any plasma source using low-pressure discharge such as inductively coupled plasma (ICP) source, or using atmospheric pressure discharge such as capacitive discharge, or any other suitable plasma source can be used interchangeably in embodiments described herein. Details of the disclosure and various implementations are discussed below.

Exemplary Chamber Hardware

Figure 1:
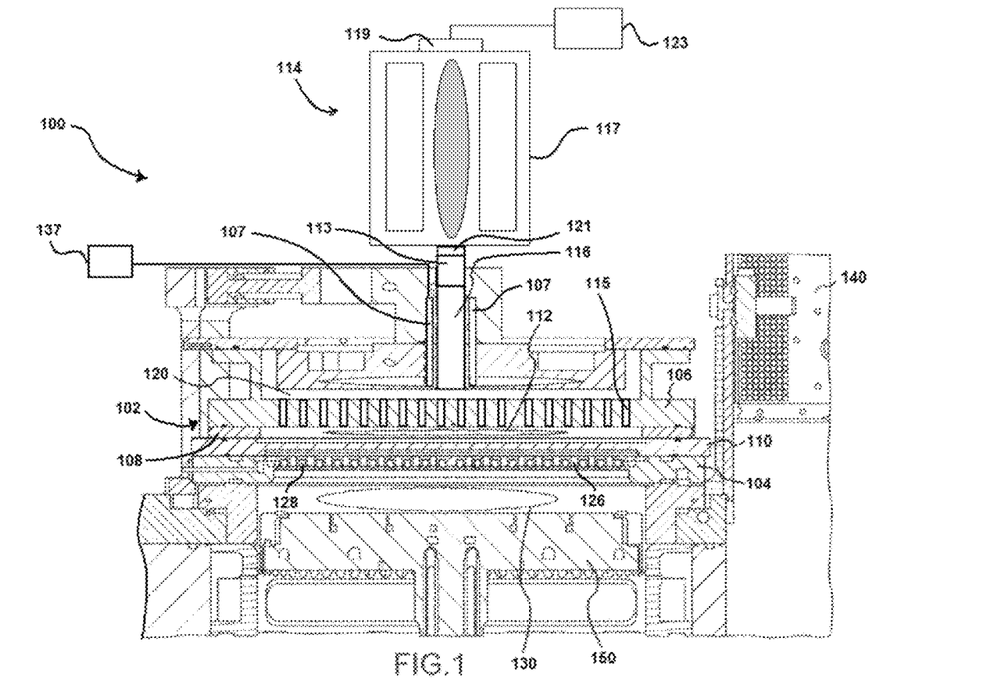
FIG. 1 is a simplified cross-sectional view of an exemplary hybrid plasma processing system according to embodiments of the disclosure.
Figure 2:
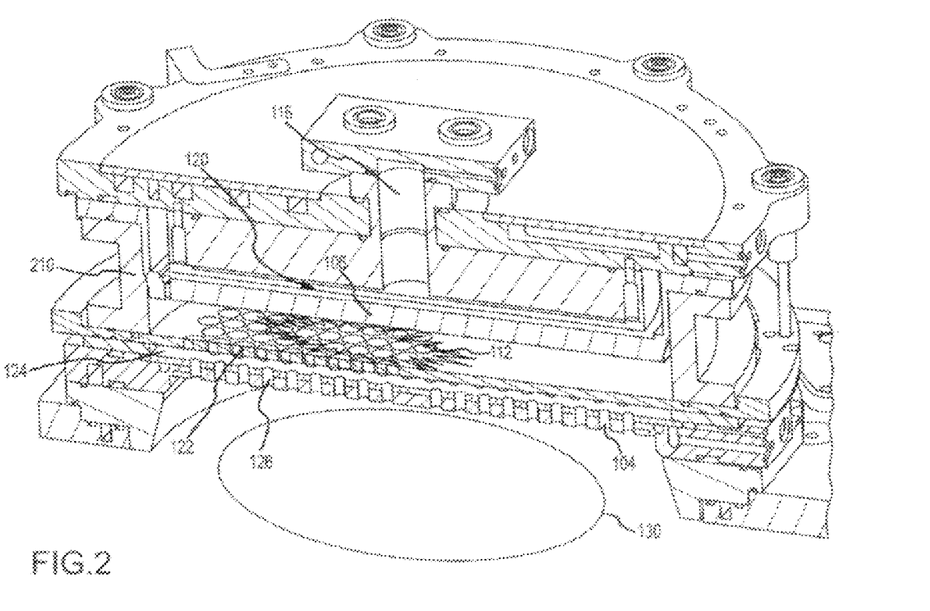
FIG. 2 is a simplified perspective view of an exemplary hybrid plasma processing system according to embodiments of the disclosure.

FIGS. 1 and 2 show cross-sectional and perspective views, respectively, of an exemplary hybrid plasma processing system 100 according to embodiments of the disclosure. The hybrid plasma processing system 100 generally includes a capacitively coupled plasma (CCP) unit 102 and a remote plasma source (RPS) unit 114 coupled to the CCP unit 102. The hybrid plasma processing system 100 may hold an internal pressure different than the outside world. For example, the pressure inside the hybrid plasma processing system 100 may be about 10 mTorr to about 20 Torr.

The CCP unit 102 functions to generate a first plasma source inside the hybrid plasma processing system 100. The CCP unit 102 may include a lid 106 and an ion suppression element 110 disposed relatively below the lid 106. The lid 106 and the ion suppression element 110 may be made of highly doped silicon or metal, such as aluminum, stainless steel, etc. The lid 106 and the ion suppression element 110 may be coated with a protective layer comprising alumina or yttrium oxide. In some embodiments, the lid 106 and the ion suppression element 110 are electrically conductive electrodes that can be electrically biased with respect to each other to generate an electric field strong enough to ionize gases between the lid 106 and the ion suppression element 110 into a plasma. A plasma generating gas mixture may be supplied to the CCP unit 102 from a gas source 137 through a gas inlet 107. An electrical insulator 108 may be disposed between the lid 106 and the ion suppression element 110 to prevent them from short circuiting when a plasma is generated. The exposed surfaces of the lid 106, insulator 108, and the ion suppression element 110 generally define a plasma excitation region 112 in the CCP unit 102.

A power supply 140 is electrically coupled to the CCP unit 102 to provide electric power to the lid 106 and/or ion suppression element 110 to generate a plasma in the plasma excitation region 112. The power supply 140 may be configured to deliver an adjustable amount of power to the CCP unit 102 depending on the process performed. The power supply 140 is operable to create an adjustable bias voltage in the ion suppression element 110 to adjust an ion concentration in the activated gas passing from the plasma excitation region 112 to the gas reaction region 130. In deposition processes for example, the power delivered to the CCP unit 102 may be adjusted to set the conformality of the deposited layer. Deposited dielectric films are typically more flowable at lower plasma powers and shift from flowable to conformal when the plasma power is increased. For example, an argon containing plasma maintained in the plasma excitation region 112 may produce a more flowable silicon oxide layer as the plasma power is decreased from about 1000 Watts to about 100 Watts or lower (e.g., about 900, 800, 700, 600, or 500 Watts or less), and a more conformal layer as the plasma power is increased from about 1000 Watts or more (e.g., about 1000, 1100, 1200, 1300, 1400, 1500, 1600, 1700 Watts or more). As the plasma power increases from low to high, the transition from a flowable to conformal deposited film may be relatively smooth and continuous or progress through relatively discrete thresholds. The plasma power (either alone or in addition to other deposition parameters) may be adjusted to select a balance between the conformal and flowable properties of the deposited film.

In one embodiment, plasma generating gases may travel from a RPS unit 114 through a gas inlet 116 into the plasma excitation region 112. The RPS unit 114 functions to generate a second plasma source inside the hybrid plasma processing system 100. The RPS unit 114 may include a tube 117 where a plasma of ions, radicals, and electrons is generated. The tube 117 may have a gas inlet 119 disposed at one end of the tube 117 and a gas outlet 121 disposed at the other end of the tube 117 opposing the gas inlet 119. The gas inlet 119 is coupled to a gas source 123 while the gas outlet 121 is in fluid communication with the plasma excitation region 112. The RPS unit 114 may be coupled to an energy source (not shown) to provide an excitation energy, such as an energy having a microwave frequency, to the RPS unit 114 to excite the process gas traveling from the gas source 123 into a plasma. The plasma generating gases from the RPS unit 114 may be used to strike a plasma in the plasma excitation region 112, or may maintain a plasma that has already been formed in the plasma excitation region 112. In some embodiments, the plasma generating gases may have already been converted (or at least partially converted) into plasma excited species in the RPS unit 114 before traveling downstream though the gas inlet 116 to the CCP unit 102. The RPS plasma excited species may include ionically-charged plasma species as well as neutral and radical species. The plasma may be formed in the RPS unit 114 using a microwave, RF, or thermal approach. When the plasma excited species reach the plasma excitation region 112, they may be further excited in the CCP unit 102, or pass through the plasma excitation region 112 without further excitation. In some operations, the degree of added excitation provided by the CCP unit 102 may change over time depending on the substrate processing sequence and/or conditions.

In general, plasma sources generated by, for example, an energetic excitation of gaseous molecules consisting of a plasma of charged ions, radicals, and electrons. In some processes where radicals of a plasma are desirable (as they react in a much more desirable manner with silicon or polysilicon material on a substrate than ions or a mixture of radicals and ions), an appropriate ion filter 113, such as electrostatic filters, wire or mesh filters, or magnetic filters, may be used between the RPS unit 114 and the CCP unit 102 to eliminate the majority or substantially all of the ions of the plasma such that only radicals of the plasma flow through the CCP unit 102 and react with silicon or polysilicon material on the substrate, thereby obtaining a greater selectivity of processing of silicon or polysilicon material than other material (e.g., silicon oxide) on the substrate. In cases where RPS radicals flow through the CCP unit 102, the CCP unit 102 may be turned on with small amount power to boost radical regeneration to compensate radical loss due to the flow path, or to change radical composition by using different RF frequency and other parameters. Alternatively, the electrodes of the CCP unit 102 may not be powered so that the radicals of the plasma from the RPS unit 114 bypass the CCP unit 102 to avoid or minimize undesired reaction occurred in the plasma excitation region 112.

The plasma generating gases and/or plasma excited species may pass through a plurality of through holes 115 in the lid 106 for a more uniform delivery into the plasma excitation region 112. The film uniformity on the substrate can also be tuned by controlling the center-to-edge distribution of the plasma generating gases and/or plasma excited species through the holes in the lid. Exemplary configurations include having the gas inlet 116 open to a gas supply region 120 partitioned from the plasma excitation region 112 by the lid 106 so that the gases/species flow through the holes 115 in the lid 106 into the plasma excitation region 112. Structural and operational features may be selected to prevent significant backflow of plasma from the plasma excitation region 112 back into the gas supply region 120, gas inlet 116, and RPS unit 114. The operational features may include maintaining a pressure difference between the gas supply region 120 and plasma excitation region 112 that maintains a unidirectional flow of plasma through the ion suppression element 110. The structural features may include the selection of dimensions and cross-sectional geometry of the holes 115 in the lid 106 that deactivates backstreaming plasma.

As noted above, the lid 106 and the ion suppression element 110 may function as a first electrode and a second electrode, respectively, so that the lid 106 and/or ion suppression element 110 may receive an electric charge. In these configurations, electrical power (e.g., RF power) may be applied to the lid 106, ion suppression element 110, or both. For example, electrical power may be applied to the lid 106 while the ion suppressor 110 is grounded. The hybrid plasma processing system 100 may include a RF generator 140 that provides electrical power to the lid 106 and/or ion suppression element 110. The electrically charged lid 106 may facilitate a uniform distribution of plasma (i.e., reduce localized plasma) within the plasma excitation region 112. To enable the formation of a plasma in the plasma excitation region 112, insulator 108 may electrically insulate the lid 106 and the ion suppression element 110. Insulator 108 may be made from a ceramic material and may have a high breakdown voltage to avoid sparking. If desired, the CCP unit 102 may further include a cooling unit (not shown) that includes one or more cooling fluid channels to cool surfaces exposed to the plasma with a circulating coolant (e.g., water).

The ion suppression element 110 may include a plurality of through holes 122 (better seen in FIG. 2) that further suppress the migration of ionically-charged species out of the plasma excitation region 112 while allowing uncharged neutral or radical species to pass through the ion suppression element 110 into an activated gas delivery region 124 (FIG. 2). These uncharged species may include highly reactive species that are transported with less reactive carrier gas through the holes 122. Therefore, the migration of ionic species through the holes 122 may be reduced, and in some instances completely suppressed. Controlling the amount of ionic species passing through the ion suppression element 110 provides increased control over the gas mixture brought into contact with the underlying wafer substrate, which in turn increases control of the deposition and/or etch characteristics of the gas mixture. For example, adjustments in the ion concentration of the gas mixture can significantly alter its etch selectivity (e.g., SiOx:SiNx etch ratios, Poly-Si:SiOx etch ratios, etc. as discussed above). It can also shift the balance of conformal-to-flowable of a deposited dielectric material.

The plurality of holes 122 may be configured to control the passage of the activated gas (i.e., the ionic, radical, and/or neutral species) through the ion suppression element 110. For example, the aspect ratio of the holes (i.e., the hole diameter to length) and/or the geometry of the holes may be controlled so that the flow of ionically-charged species in the activated gas passing through the ion suppression element 110 is reduced. The holes 122 in the ion suppression element 110 may include a tapered portion that faces the plasma excitation region 112, and a cylindrical portion that faces a gas distribution plate or showerhead 104. The cylindrical portion may be shaped and dimensioned to control the flow of ionic species passing to the showerhead 104. An adjustable electrical bias may also be applied to the ion suppression element 110 as an additional means to control the flow of ionic species through the ion suppression element 110.

The showerhead 104 is positioned between the ion suppression element 110 of the CCP unit 102 and a gas reaction region 130 (i.e., gas activation region) that makes contact with a substrate that may be placed on a pedestal 150. The gases and plasma excited species may pass through the ion suppression element 110 into an activated gas delivery region 124 that is defined between the ion suppression element 110 and the showerhead 104. A portion of these gases and species may further pass through the showerhead 104 into a gas reaction region 130 in which the substrate is disposed.

In one embodiment shown in FIG. 1, the showerhead 104 may be a dual-zone showerhead that has a first set of channels 126 to permit the passage of plasma excited species coming from the plasma excitation region 112, and a second set of channels 128 that deliver a second gas/precursor mixture into the gas reaction/activation region 130. The first set of channels 126 may traverse the thickness of the showerhead 104. Each channel of the first set of channels 126 may have an opening facing the gas reaction/activation region 130, and the opening may have a smaller diameter than the diameter of the channel 126. The second set of channels 128 in the showerhead 104 may not traverse the thickness of the showerhead 104. Therefore, the second set of channels 128 are not in fluid communication with the plasma excitation region 112. Instead, the second set of channels 128 are fluidly coupled to a source gas/precursor mixture (not shown) that is selected for the process to be performed. For example, when the hybrid plasma processing system 100 is configured to perform a deposition of a dielectric material such as silicon dioxide (SiOx), the gas/precursor mixture may include a silicon-containing gas or precursor such as silane, disilane, TSA, DSA, TEOS, OMCTS, TMDSO, among other silicon-containing materials. This mixture is provided to the second set of channels 128 and then the gas reaction region 130 where the mixture is reacted with an oxidizing gas mixture that may include plasma excited species, such as plasma generated radical oxygen (O), activated molecular oxygen ($O_2$) and ozone ($O_3$), among other species. Excessive ions in the plasma excited species may be reduced as the species move through the holes 122 in the ion suppression element 110, and reduced further as the species move through the first set of channels 126 in the showerhead 104.

In another example, when the hybrid plasma processing system 100 is configured to perform an etch on the substrate surface, the source gas/precursor mixture may include etchants such as oxidants, halogens, water vapor and/or carrier gases that mix in the gas reaction region 130 with plasma excited species distributed from the first set of channels 126 in the showerhead 104

The two sets of channels 126, 128 prevent the plasma excited species and second gas/precursor mixture from combining until they reach the gas reaction region 130. In some embodiments, one or more of the holes 122 in the ion suppression element 110 may be aligned with one or more of the first set of channels 126 in the showerhead 104 to allow at least some of the plasma excited species to pass through a hole 122 and a channel 126 without altering their direction of flow. In some embodiments, the second set of channels 128 may have an annular shape at the opening facing the gas reaction region 130, and these annular openings may be concentrically aligned around the circular openings of the first set of channels 126.

The hybrid plasma processing system 100 also includes a pedestal 150 that is operable to support and move the substrate (e.g., a wafer substrate). The distance between the pedestal 150 and the showerhead 104 help define the gas reaction region 130. The pedestal may be vertically or axially adjustable within the processing chamber 100 to increase or decrease the gas reaction region 130 and effect the deposition or etching of the wafer substrate by repositioning the wafer substrate with respect to the gases passed through the showerhead 104. The pedestal 150 may have a heat exchange channel through which a heat exchange fluid (e.g., water) flows to control the temperature of the wafer substrate. Circulation of the heat exchange fluid allows the substrate temperature to be maintained at relatively low temperatures (e.g., about −20° C. to about 90° C.). The pedestal 150 may also be configured with a heating element (such as a resistive heating element) embedded therein to maintain the substrate at desired heating temperatures (e.g., about 90° C. to about 1100° C.).

Embodiments of the disclosure illustrated in FIGS. 1 and 2 provide a hybrid plasma processing system incorporating a RPS unit 114 with a CCP unit 102 for substrate processing. By combining a RPS unit 114 with a CCP unit 102, the plasma excited species may be generated by the CCP unit 102 alone, the RPS unit 114 alone, or both. The CCP unit 102 may serve as a primary plasma source while the RPS unit 114 may serve as a secondary plasma source, or vice versa, depending upon the process scheme. In cases where the process requires higher power input (550 W or above), both CCP unit 102 and RPS unit 114 may be used to generate plasma excited species so that some power burden is shifted from the CCP unit 102 to the RPS unit 114, which allows the CCP unit 102 to operate at lower power, thereby reducing ion bombardment of the powered electrode in the CCP to a lesser extent. As a result, particle contamination of the substrate surface due to ion bombardment of the protective coating layer on the powered electrode of the CCP unit 102 is reduced.

Figure 3:
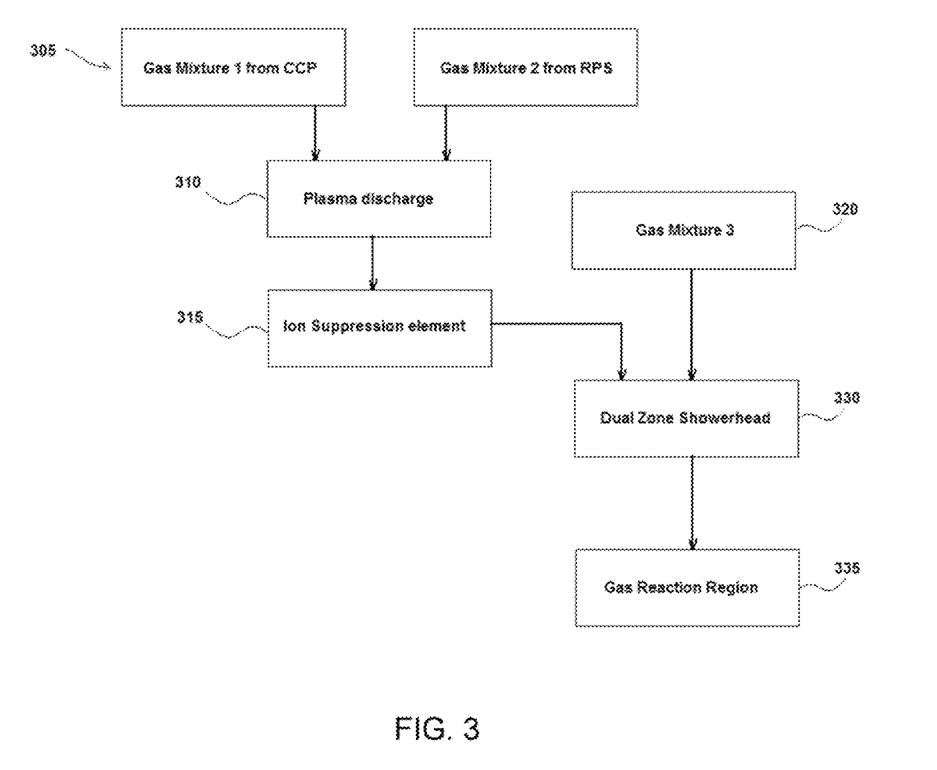
FIG. 3 is a simplified schematic of the gas flow paths of a pair of gas mixtures through the hybrid plasma processing system of FIG. 1 according to embodiments of the disclosure.

FIG. 3 shows a simplified schematic 300 of the gas flow paths of a pair of gas mixtures through the hybrid plasma processing system 100 of FIG. 1 according to embodiments of the disclosure. At block 305, a first gas, such as a plasma generating gas mixture, is supplied to a CCP unit 102 via a gas inlet 107. An exemplary first gas may include one or more of the following gases: $CF_4$, $NH_3$, $NF_3$, Ar, He, $H_2O$, $H_2$, $O_2$, etc. At block 310, the first gas may be excited through a plasma discharge within the plasma excitation region 112 of the CCP unit 102 to form one or more plasma effluents. Alternatively (or in addition to the primary plasma generation within the CCP unit 102), a remote plasma system (RPS) unit 114 coupled to the hybrid plasma processing system 100 may be turned on to generate a secondary plasma (from a second gas source) whose plasma excitation products, which may introduce into the plasma excitation region 112 through the gas inlet 116, or flow through or bypass the CCP unit 102 and to the gas reaction region 130 downstream the CCP unit 102 through the first set of channels 126 in the showerhead 104. The RPS plasma excitation products may include ionically-charged plasma species as well as neutral and radical species. The plasma generating gas mixture flowing to the CCP unit 102 may be the same or different than the plasma generating gas mixture flowing to the RPS unit 114. In any cases, the RPS and CCP plasma source should be turned on in an appropriate sequence, either through the process receipt or hardware tuning, to avoid crosstalk between two sources and lost of power, which may potentially damage the chamber parts/substrate.

As noted above, in cases where RPS plasma excitation products flow through the CCP unit 102 to prevent the mixing of RPS plasma excitation products with the plasma effluents within the plasma excitation region 112 from happening very upstream (to enhance the lifetime of the plasma species), the CCP unit 102 may be turned on with small amount of power to boost radical regeneration to compensate loss due to the flow path, or change radical composition by using different RF frequency and other parameters to react with the plasma effluents within the plasma excitation region 112, thus providing extra process tuning knobs.

At block 315, whether the plasma effluents are generated by the CCP unit 102, the RPS unit 114, or both, they may be passed through an ion suppression element 110 in the CCP unit 102. The ion suppression element 110 may block and/or control the passage of ionic species while allowing the passage of radical and/or neutral species as the plasma activated first gas travels to the gas reaction region 130 in the hybrid plasma processing system 100. At block 320, a third gas may be optionally introduced into the hybrid plasma processing system 100 to the gas reaction region 130 through the second set of channels 128 in the showerhead 104. As noted above, the contents of the third gas may vary depending on the process performed. For example, the third gas may include hydrogen, helium, argon or any deposition compounds (e.g., Si-containing compounds) for deposition processes and etchants for etch processes. Contact and reaction between the first, second and third gases may be prevented until the gases arrive at the gas reaction region 130 of the hybrid plasma processing system 100.

One way to prevent the first, second and third gases from interacting before the gas reaction region is to have them flow though separate channels in a dual-zone showerhead 104. At block 330, the activated first gas (and activated second gas from RPS, if used) flows through a first set of channels 126 in the showerhead 104 without interacting with the third gas that passes through a second set of channels 128. At block 335, after exiting the showerhead 104, the activated first gas (and activated second gas from RPS, if used) and third gases may mix together in the gas reaction region 130 of the hybrid plasma processing system 100. Depending on the process performed, the combined gases may react to deposit a material on the exposed surfaces of the substrate, etch materials from the substrate, or both.

In any of the embodiments discussed throughout this disclosure, either the RPS or the RF plasma can be used as primary or secondary radical source for substrate processing depending on process requirements. RPS can be placed further away from the substrate processing area whereas the other RF plasma source can be placed very close to wafer processing area. For certain process gases, RPS has shown great productivity and reliability performance; however, the same process gases may exert great burden to other RF plasma source, causing productivity and reliability issue, such as defectively and parts degradation. In the presence of such gases, RPS can be used as the primary source for radicals, and RPS radical flow can flow through or bypass the RF plasma source. In the case of RPS flow through RF plasma source, the RF plasma source can be turned on with small amount power to boost radical regeneration to compensate loss from the flow path, or to change radical composition by using different RF frequency and other parameters, thus provide extra process tuning knobs. At the meantime small power can sustain the RF plasma source part condition. For process gases which need to be disassociated close to the substrate, RF plasma source may be the primary source for substrate processing, and the disassociated gases can be delivered to the substrate level efficiently.

Figure 4:
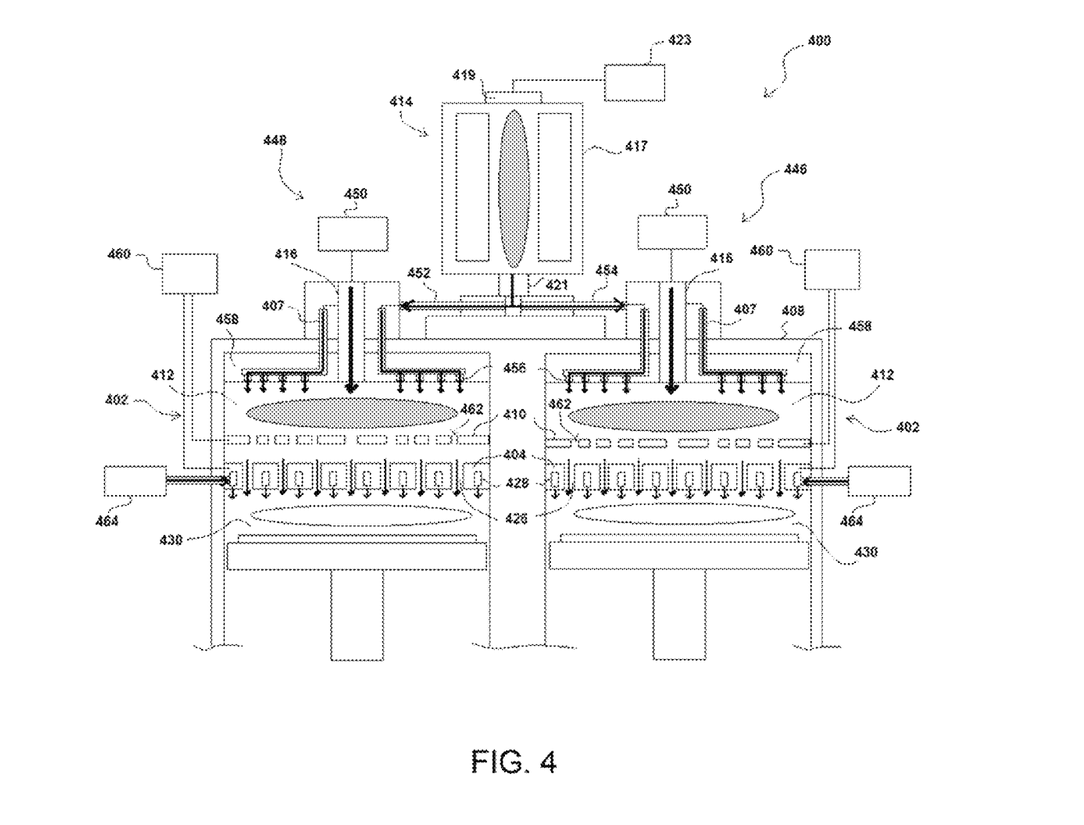
FIG. 4 is a simplified cross-sectional view of another exemplary hybrid plasma processing system according to embodiments of the disclosure.

FIG. 4 is a simplified cross-sectional view of an exemplary hybrid plasma processing system 400 showing an exemplary gas flow in bold lines according to embodiments of the disclosure. The hybrid plasma processing system 400 includes a remote plasma source (RPS) unit 414 shared by a tandem processing chamber 446, 448. The hybrid plasma processing system 400 may have a housing 408 covering a respective one of the tandem processing chambers 446, 448. The processing chambers 446, 448 may be positioned adjacent to each other in a symmetrical or asymmetrical manner. The RPS unit 414 may be disposed at any location on the housing 408 for ease of sharing RPS plasma excitation products between the tandem processing chambers 446, 448. Each of the tandem processing chambers 446, 448 has its own capacitively coupled plasma (CCP) unit 402, which includes a lid 458 (i.e., top electrode) and an ion suppression element 410 (i.e., bottom electrode). The lid 410 and a showerhead 404 disposed relatively below the CCP unit 402 may be coupled to an electrical power (e.g., RF power) 460. Generally, the tandem processing chambers 446, 448 are substantially identical to the hybrid plasma processing system 100 shown in FIGS. 1 and 2 except that gas inlet 407 is modified to receive plasma excitation products from the RPS unit 414 while the gas inlet 416 is modified to receive a first gas from a gas source 450.

A first gas, such as a plasma generating gas mixture discussed above with respect to FIGS. 1-3, may be supplied from the gas source 450 to the CCP unit 402 via a gas inlet 416. The first gas is then excited through a plasma discharge within the plasma excitation region 412 of the CCP unit 402 to form one or more plasma effluents. In one embodiment, the gas inlet 416 may be disposed in the center of the lid 458 and surrounded by a plurality of holes 456 distributed between the center and edge of the lid 458. The holes 456 are used to introduce RPS plasma excitation products into the plasma excitation region 412. The number of the holes 456 may be between about 100 and about 5000. The holes 456 may be configured to block ions and allow only the radicals in the RPS plasma excitation products to go through by controlling the hole's aspect ratio and the size of hole in terms of the diameter and length. As noted above, the gas inlet 416 and holes 456 may be configured and arranged to modulate the flow between the center and the edge within the plasma excitation region 412 in a desired manner (i.e., controlling the center-to-edge distribution) to tune the film uniformality on the substrate.

The RPS unit 414 may include a tube 417 where a plasma of ions, radicals, and electrons is generated. The tube 417 may have a gas inlet 419 disposed at one end of the tube 417 and a gas outlet 421 disposed at the other end of the tube 417 opposing the gas inlet 419. The gas inlet 419 is coupled to a gas source 423 while the gas outlet 421 is in fluid communication with the plasma excitation region 412 of the CCP unit 402 in each of the tandem processing chambers 446, 448. The RPS unit 414 may be coupled to an energy source (not shown) to provide an excitation energy, such as an energy having a microwave frequency, to the RPS unit 414 to excite the process gas from the gas source 423 into a plasma. The RPS plasma excitation products are introduced from the RPS unit 414 to the processing chambers 446, 448 via respective gas passageways 452, 454. The gas passageways 452, 454 are in fluid communication with the gas inlet 407, which disperses RPS plasma excitation products into the plasma excitation region 412 through the holes 456 formed in a lid 458. The plasma generating gases from the RPS unit 414 may be used to strike a plasma in the plasma excitation region 412, or may maintain a plasma that has already been formed in the plasma excitation region 412 as discussed above.

In some embodiments, the plasma generating gases from the RPS unit 414 and/or the plasma effluents from the CCP unit 402 may flow through holes 462 in the ion suppression element 410 and then a first set of channels 426 in a showerhead 404 and into a gas reaction region 430. As discussed above, the RPS plasma excitation products may or may not react with the plasma effluents (from the CCP unit 402) generated within the plasma excitation region 412. In cases where the RPS plasma excitation products flow through CCP unit 402, the CCP unit 402 may be turned on with small amount of power to boost radical regeneration to compensate loss due to the flow path, or change radical composition by using different RF frequency and other parameters to react with the plasma effluents within the plasma excitation region 412 as discussed above with respect to FIG. 3. In the meantime, the small power can sustain the RF plasma source condition.

In some embodiments, a second gas may be optionally introduced into a second set of channels 428 in the showerhead 404 from a gas source 464. The second set of channels 428 flow the second gas into the gas reaction region 130 through the second set of channels 128 in the showerhead 104. As noted above, the contents of the second gas may vary depending on the process performed. The plasma effluents from the CCP unit 402 and second gases (and RPS plasma excitation products from the RPS unit 414 if used) may mix together in the gas reaction region 130 within each of the tandem processing chamber 446, 448. Depending on the process performed, the combined gases may react to deposit a material on the exposed surfaces of the substrate, etch materials from the substrate, or both.

In some alternative embodiments, instead of sharing the same RPS unit 414, each of processing chambers 446, 448 may each has its own remote plasma source (RPS) unit disposed external to the processing chamber 446, 448. In some aspects, the gas source of the RPS unit for the processing chamber 446 and the gas source of the RPS unit for the processing chamber 448 may or may not be the same.

While the CCP unit is illustrated as an example for the RF plasma source in this disclosure, the disclosure contemplates any plasma source using low-pressure discharge such as inductively coupled plasma (ICP) source, or using atmospheric pressure discharge such as capacitive discharge, or any other suitable plasma source can be used interchangeably in embodiments described herein. In any cases, either the RPS or the RF plasma (or any other type of plasma source) can be used as primary or secondary radical source for substrate processing depending upon the process requirements. For process gases which need to be disassociated close to the substrate, the RF plasma source may be used as the primary source for substrate processing so that the disassociated gases can be delivered to the substrate level efficiently.

In summary, embodiments of the disclosure provide a hybrid plasma processing system incorporating a RPS unit with a CCP unit for substrate processing. By combining a RPS unit with a CCP unit, the plasma excited species (particularly neutral and radical species) may be generated by the CCP unit alone, the RPS unit alone, or both. The CCP unit may serve as a primary plasma source while the RPS unit may serve as a secondary plasma source, or vice versa, depending upon the process scheme. In cases where the process requires higher power input (550 W or above), both CCP unit and RPS unit may be used to generate plasma excited species so that some power burden is shifted from the CCP unit to the RPS unit, which allows the CCP unit to operate at lower power, thereby reducing ion bombardment of the powered electrode in the CCP to a lesser extent. As a result, particle contamination of the substrate surface due to ion bombardment of the protective coating layer on the powered electrode of the CCP unit is reduced.

While the foregoing is directed to embodiments of the present disclosure, other and further embodiments of the disclosure may be devised without departing from the basic scope thereof, and the scope thereof is determined by the claims that follow.

The invention claimed is:

1. A substrate processing system, comprising:
a first processing chamber comprising:
a first primary plasma source unit, comprising:
a first lid having one or more through holes, wherein the first lid is in fluid communication with a first gas source; and
a first ion suppression element, wherein the first lid and the first ion suppression element define a first plasma excitation region therebetween; and
a first gas distribution plate disposed between the first ion suppression element and a first substrate support, wherein the first gas distribution plate and the first substrate support defines a first substrate processing region therebetween; and
a second processing chamber comprising:
a second primary plasma source unit, comprising:
a second lid having one or more through holes, wherein the second lid is in fluid communication with a second gas source; and
a second ion suppression element, wherein the second lid and the second ion suppression element define a second plasma excitation region therebetween; and
a second gas distribution plate disposed between the second ion suppression element and a second substrate support, wherein the second gas distribution plate and the second substrate support defines a second substrate processing region therebetween; and
a remote plasma source (RPS) coupled to the first processing chamber and the second processing chamber.

2. The substrate processing system of claim 1, wherein the first external gas source and the second external gas source are the same gas source.

3. The substrate processing system of claim 1, wherein the first and second gas distribution plates each have:
a first set of channels configured to traverse the thickness of the respective gas distribution plate to permit passage of plasma excited species from the respective plasma excitation region; and
a second set of channels configured to deliver a gas mixture from a third gas source to the respective substrate processing region, wherein the second set of channels is not in fluid communication with the respective plasma excitation region.

4. The substrate processing system of claim 1, wherein the RPS unit and the first primary plasma source unit are both turned on during processing of a substrate.

5. The substrate processing system of claim 1, wherein the RPS unit and the second primary plasma source unit are both turned on during processing of a substrate.

6. The substrate processing system of claim 1, wherein the first primary plasma source has one or more gas inlets fluidly connecting to the first external gas source, wherein the one or more gas inlets are in fluid communication with the first plasma excitation region through the one or more through holes of the first lid.

7. The substrate processing system of claim 1, wherein the second primary plasma source has one or more gas inlets fluidly connecting to the second external gas source, wherein the one or more gas inlets are in fluid communication with the second plasma excitation region through the one or more through holes of the second lid.

8. The substrate processing system of claim 1, wherein the first ion suppression element has a plurality of through holes configured to allow only electrically neutral radicals to pass through.

9. The substrate processing system of claim 1, wherein the second ion suppression element has a plurality of through holes configured to allow only electrically neutral radicals to pass through.

10. The substrate processing system of claim 8, wherein each of the through holes of the first ion suppression element includes a tapered portion facing the first plasma excitation region and a cylindrical portion facing the first gas distribution plate.

11. The substrate processing system of claim 9, wherein each of the through holes of the first ion suppression element includes a tapered portion facing the first plasma excitation region and a cylindrical portion facing the first gas distribution plate.

12. The substrate processing system of claim 1, wherein the first primary plasma source unit is a capacitively coupled plasma (CCP) unit, an inductively coupled plasma (ICP) source, or a plasma source using low-pressure or atmospheric pressure discharge.

13. The substrate processing system of claim 1, wherein the second primary plasma source unit is a capacitively coupled plasma (CCP) unit, an inductively coupled plasma (ICP) source, or a plasma source using low-pressure or atmospheric pressure discharge.

14. The substrate processing system of claim 3, wherein the first set of channels of the first gas distribution plate is in fluid communication with the first primary plasma source unit and the RPS unit.

15. The substrate processing system of claim 3, wherein the first set of channels of the second gas distribution plate is in fluid communication with the second primary plasma source unit and the RPS unit.

16. The substrate processing system of claim 1, wherein the first lid and the first ion suppression element are coated with a protective layer comprising alumina or yttrium oxide.

17. The substrate processing system of claim 1, wherein the second lid and the second ion suppression element are coated with a protective layer comprising alumina or yttrium oxide.

* * * * *